(12) United States Patent
Zhang et al.

(10) Patent No.: US 11,557,514 B2
(45) Date of Patent: Jan. 17, 2023

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventors: Tiantian Zhang, Shanghai (CN); Jingjing Tan, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/991,732

(22) Filed: Aug. 12, 2020

(65) Prior Publication Data

US 2021/0057272 A1    Feb. 25, 2021

(30) Foreign Application Priority Data

Aug. 23, 2019  (CN) .......................... 201910786558.X

(51) Int. Cl.
| H01L 21/768 | (2006.01) |
| H01L 21/285 | (2006.01) |
| H01L 23/522 | (2006.01) |
| H01L 23/532 | (2006.01) |

(52) U.S. Cl.
CPC .. *H01L 21/76844* (2013.01); *H01L 21/76831* (2013.01); *H01L 23/5226* (2013.01); *H01L 21/28568* (2013.01); *H01L 21/76879* (2013.01); *H01L 23/53209* (2013.01); *H01L 23/53266* (2013.01)

(58) Field of Classification Search
CPC ......... H01L 21/76802; H01L 21/76825; H01L 21/76826; H01L 21/76814; H01L 21/76831; H01L 29/76829; H01L 21/76832; H01L 21/76879
See application file for complete search history.

(56) References Cited

U.S. PATENT DOCUMENTS 10,170,322 B1 * 1/2019 Cheng ............... H01L 21/76826
2017/0365550 A1 * 12/2017 Clevenger ............... H01L 28/60

* cited by examiner

*Primary Examiner* — Thanhha S Pham
(74) *Attorney, Agent, or Firm* — Anova Law Group, PLLC

(57) ABSTRACT

Semiconductor device and fabrication method are provided. The method for forming the semiconductor device includes providing a substrate; forming a dielectric layer on the substrate; forming a through hole in the dielectric layer, the through hole exposing a portion of a top surface of the substrate; performing a surface treatment process on the dielectric layer of sidewalls of the through hole; and filling a metal layer in the through hole.

7 Claims, 7 Drawing Sheets

SEMICONDUCTOR DEVICE AND FABRICATION METHOD THEREOF

CROSS-REFERENCES TO RELATED APPLICATION

This application claims the priority of Chinese Patent Application No. 201910786558.X, filed on Aug. 23, 2019, the content of which is incorporated by reference in its entirety.

TECHNICAL FIELD

The present disclosure generally relates to the field of semiconductor manufacturing technology and, more particularly, relates to semiconductor devices and fabrication methods of the semiconductor devices.

BACKGROUND

With rapid development of semiconductor manufacturing technology, semiconductor devices are developed in a trend having higher component densities and higher integration levels. In order to adapt to a smaller critical dimension, a channel length of an existing planar metal-oxide-semiconductor field-effect transistor (MOSFET) is also increasingly reduced. However, as a channel length of a device keeps shrinking, the channel control capability of a gate structure deteriorates, and there is increasing difficulty in pinching the channel off by a gate voltage, resulting in a higher possibility of subthreshold leakage, that is, the so-called short-channel effect (SCE). Consequently, the electrical performance of the semiconductor device may be degraded.

In the manufacturing process of the semiconductor device, a through hole needs to be formed in the dielectric layer, and a metal layer will be filled in the through hole to realize the connection between the transistor and the metal layer. However, due to the poor adhesion force between the metal layer and the through hole, the metal layer may have poor forming quality at the interface between the metal layer and the through hole. As a result, devices under the through hole may be damaged during the process of filling the metal layer in the through hole.

Thus, there is a need to provide a metal layer with high quality in the through hole, and thus to provide the formed semiconductor device with desirable device performance. The disclosed devices and methods are directed to at least partially alleviate one or more problems set forth above and to solve other problems in the art.

SUMMARY

Embodiments and implementations of the present disclosure provide a semiconductor structure and a formation method thereof, so that a semiconductor device is formed with good device performance and high yield.

One aspect of the present disclosure provides a method for forming the semiconductor device. The method includes providing a substrate; forming a dielectric layer on the substrate; forming a through hole in the dielectric layer, the through hole exposing a portion of a top surface of the substrate; performing a surface treatment process on the dielectric layer of sidewalls of the through hole; and filling a metal layer in the through hole.

Optionally, the surface treatment process includes a plasma surface treatment process, an ion doping process, or a combination thereof.

Optionally, a type of the surface treatment process is a ruthenium type of surface treatment process, a tungsten type of surface treatment process, a cobalt type of surface treatment process, a titanium type of surface treatment process, or a combination thereof.

Optionally, a type of the metal layer is the same as the type of the surface treatment process.

Optionally, the substrate includes a conductive plug, and the through hole exposes a portion of a top surface of the conductive plug.

Optionally, the method further includes forming an etch stop layer on the substrate before forming the dielectric layer.

Optionally, the etch stop layer is etched to expose the portion of the top surface of the conductive plug before filling the metal layer in the through hole.

Optionally, the dielectric layer is made of a non-nitrogen-containing material a nitrogen-containing material, or a combination thereof.

Optionally, performing a nitridation surface treatment on the dielectric layer of the sidewalls of the through hole, before the surface treatment process of the dielectric layer, when the dielectric layer is made of the non-nitrogen-containing material.

Optionally, the dielectric layer is formed by a chemical vapor deposition process, an atomic layer deposition process, a physical vapor deposition process, or a combination thereof.

Another aspect of the present disclosure provides a semiconductor device. The semiconductor device includes: a substrate; and a dielectric layer on the substrate. A through hole is formed in the dielectric layer exposing a portion of a top surface of the substrate and a surface treatment process is performed on the dielectric layer of the sidewalls of the through hole. The semiconductor device further includes a metal layer filled in the through hole.

Optionally, the surface treatment process includes a plasma surface treatment process, an ion doping process, or a combination thereof.

Optionally, the surface treatment process includes a ruthenium-containing surface treatment, a tungsten-containing surface treatment, a cobalt-containing surface treatment, a titanium-containing surface treatment, or a combination thereof.

Optionally, the metal layer is made of a material containing a same metal as used in the surface treatment process.

Optionally, the substrate includes a conductive plug and the through hole exposes a portion of a top surface of the conductive plug.

Optionally, the semiconductor device further includes an etch stop layer between the substrate the dielectric layer.

Optionally, the through hole extends through the etch stop layer to expose the portion of the top surface of the conductive plug.

Optionally, the dielectric layer is made of a non-nitrogen-containing material or a nitrogen-containing material.

Optionally, performing a nitridation surface treatment on the dielectric layer of the sidewalls of the through hole, before the surface treatment process of the dielectric layer, when the dielectric layer is made of the non-nitrogen-containing material.

Optionally, the dielectric layer is formed by a chemical vapor deposition process, an atomic layer deposition process, a physical vapor deposition process, or a combination thereof.

Comparing with the conventional technologies, the technical solutions of the present disclosure provide following advantages.

The surface treatment process is performed on the dielectric layer on the sidewalls of the through hole before the metal layer is filled, so that the adhesion force between the subsequently filled metal layer and the dielectric layer on the sidewalls of the through hole is improved. As such, a good forming quality is achieved between the metal layer and the through hole and the performance and the yield of the formed semiconductor device may be improved. The reason is that, after the surface treatment process on the dielectric layer on the sidewalls of the through hole, the material property difference between the surface of the dielectric layer and the filled metal layer is very small, so that when the metal layer 300 is filled in, the adhesion force between the metal layer and the sidewalls of the through hole is improved and the metal layer and the dielectric layer have good forming qualities. As such, the quality and the yield of the formed semiconductor device may be improved.

Other aspects of embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

When forming a semiconductor device, a metal layer needs to be filled in a through hole to realize electrical connection between a transistor and the metal layer. However, after the metal layer is filled in the through hole and then planarized, the adhesion force between the filled metal layer and the dielectric layer of the sidewalls of the through hole is weak. During planarization process, the metal layer and the dielectric layer of the sidewalls of the through hole may be stripped away from each other due to the action of the external force, so that holes or gaps may be formed between the metal layer and the sidewalls of the through hole. As a result, the chemical liquid used and the impurities generated in the planarization process can reach the surface of the transistor along the hole or the gap. Damages to the transistor may be generated, the device performance and yield of the formed semiconductor device may be decreased, and the use of the semiconductor device may be limited.

Figure 1:
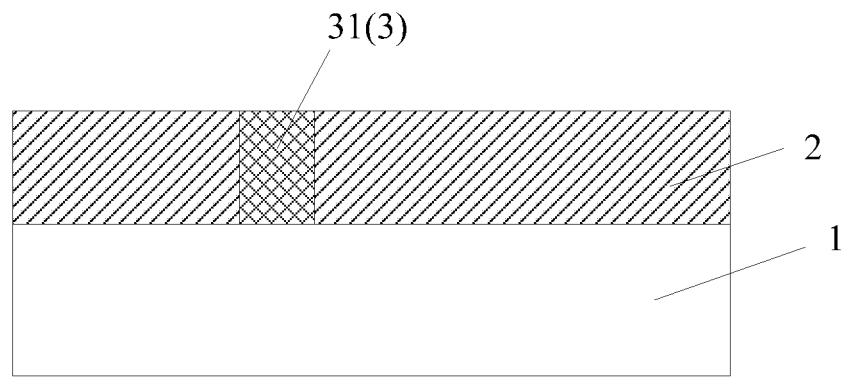
FIGS. 1-5 illustrate schematic cross-sectional views of semiconductor structures at certain stages of a fabrication process of a semiconductor structure.

Referring to FIG. 1, a substrate 1 may be provided. An interlayer dielectric layer 2 may be formed on the substrate 1, a contact hole 3 may be formed in the interlayer dielectric layer 2, and a first metal layer 31 may be filled in the contact hole 3.

Figure 2:
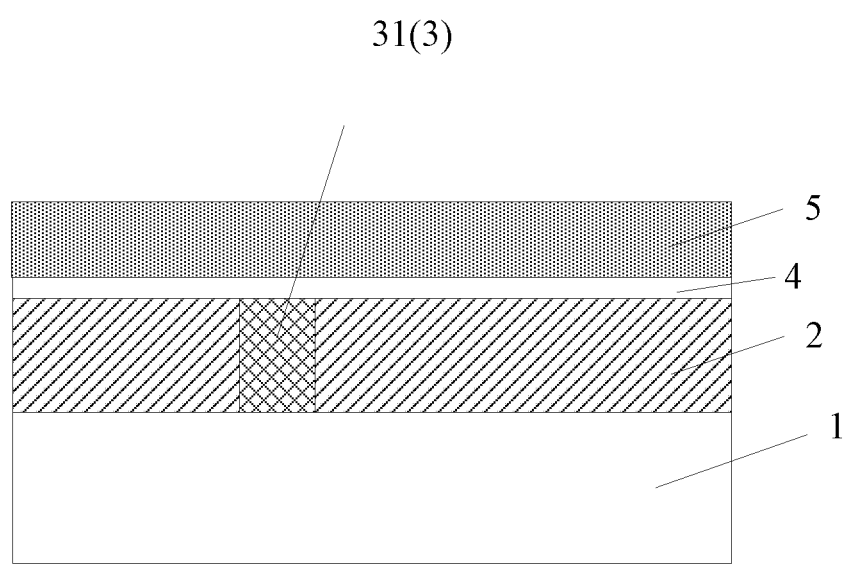

Referring to FIG. 2, an etch stop layer 4 may be formed on the interlayer dielectric layer 2 and the first metal layer 31. A dielectric layer 5 may be formed on the etch stop layer 4.

Figure 3:
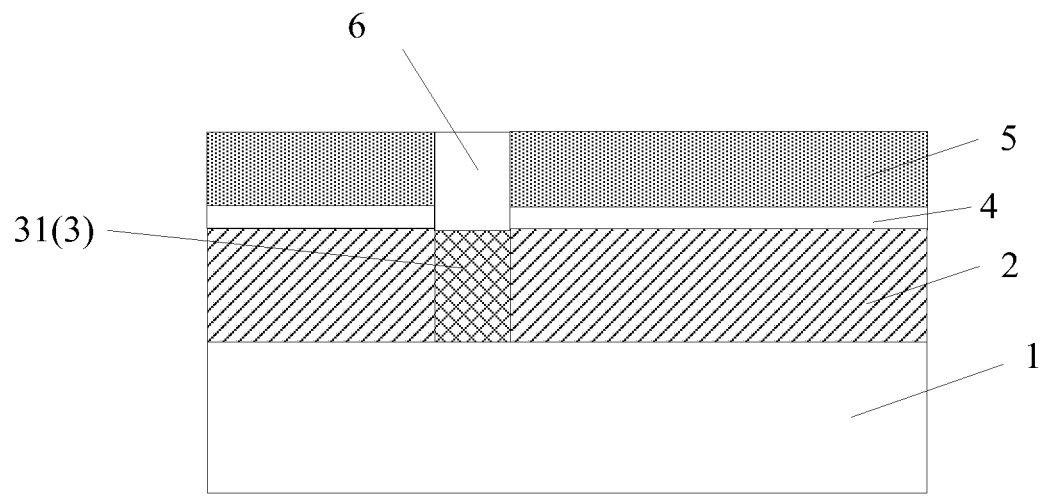

Referring to FIG. 3, the dielectric layer 5 and the etch stop layer 4 are patterned until a top surface of the first metal layer 31 is exposed and a through hole 6 is formed.

Figure 4:
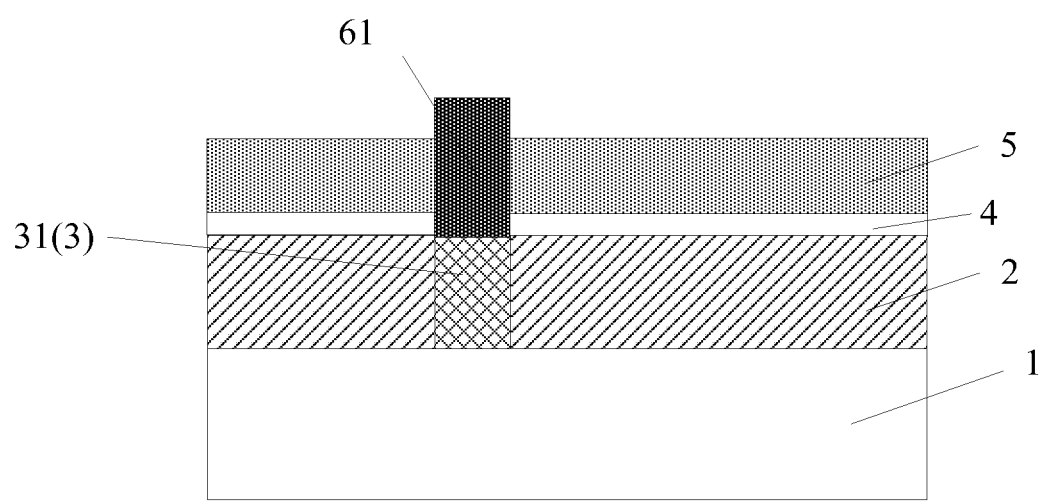

Referring to FIG. 4, a second metal layer 61 may be filled in the through hole 6.

Figure 5:
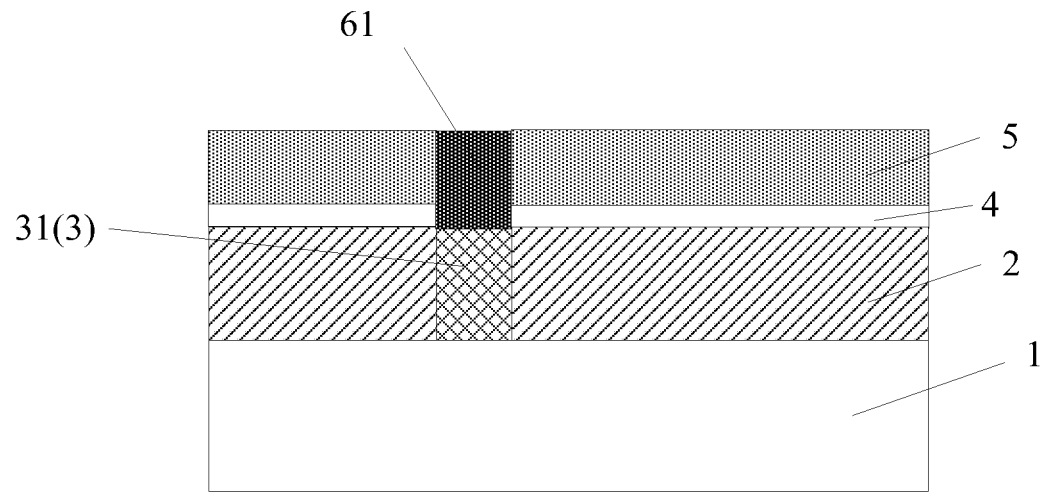

Referring to FIG. 5, the second metal layer 61 may be planarized until a top surface of the second metal layer 61 is coplanar with a top surface of the dielectric layer 5.

The present disclosure illustrates that the performance stability of the semiconductor device formed by the above method is poor and failure phenomenon is prone to occur, which limit the usage of the semiconductor device. This is because the material property of the formed second metal layer 61 is quite different from that of the dielectric layer 5, so that the second metal layer 61 and the dielectric layer 5 are not easy to adhere to each other. The adhesion force between the second metal layer 61 and the dielectric layer 5 is small, which results in a poor forming quality between the second metal layer 61 and the dielectric layer 5. When the second metal layer 61 is planarized, a striping phenomenon may occur between the second metal layer 61 and the dielectric layer 5. As a result, chemical liquid used and impurities generated in the planarization process may leak along a gap or hole to the surface of the first metal layer 31, so that damages to the first metal layer 31 may occur and the formed semiconductor device may have poor performance.

The present disclosure illustrates that before the metal layer is filled in the through hole, a surface treatment process may be performed on the dielectric layer of the sidewalls of the through hole, such that the treated surface of the dielectric layer has a material property similar to that of the metal layer. Thus, when the metal layer is filled in the through hole, the metal layer and the surface of the dielectric layer are easy to bond to each other due to the fact that the material property difference between the metal layer and the dielectric layer is small. As a result, a good forming quality may be realized between the metal layer and the dielectric layer, and it is assured that the metal layer and the dielectric layer do not stripe off during the subsequent planarization of the metal layer. As such, the performance and the yield of the formed semiconductor device may be improved.

In order to make the above objects, features, and advantages of the present disclosure more comprehensible, specific embodiments of the disclosure are described in detail below with reference to the accompanying drawings.

Figure 10:
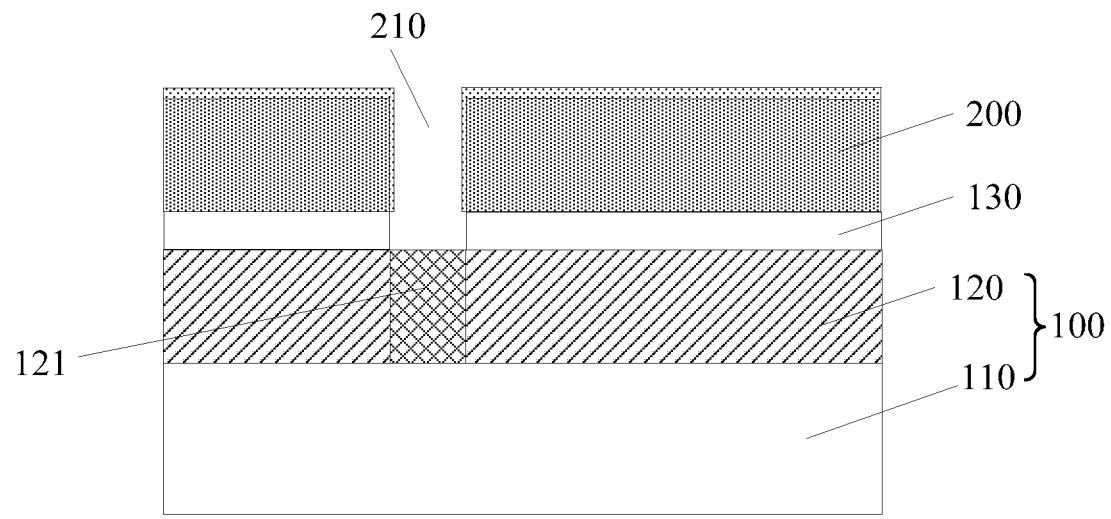
Figure 11:
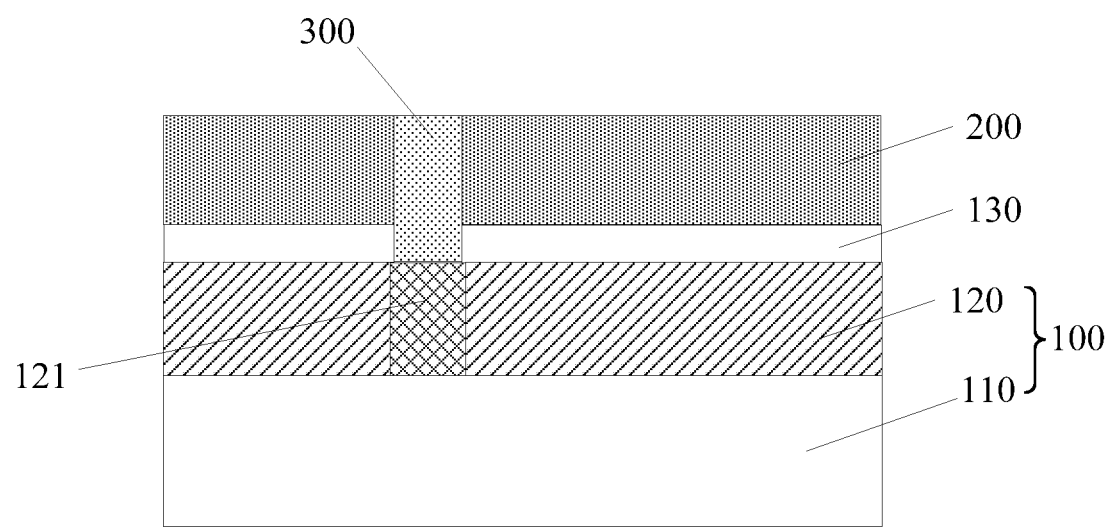
Figure 12:
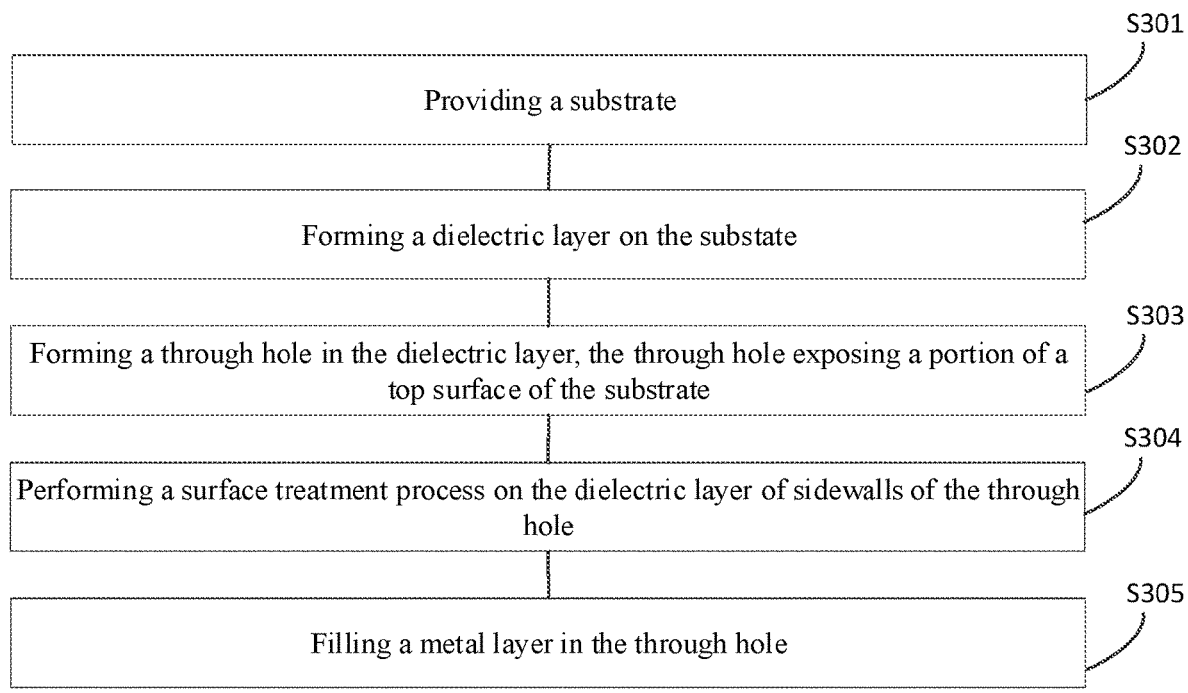
FIG. 12 illustrates a flowchart of an exemplary method for fabricating a semiconductor structure consistent with some embodiments of the present disclosure.

FIGS. 6-11 illustrate schematic cross-sectional views of semiconductor structures at certain stages of an exemplary method for fabricating a semiconductor structure consistent with some embodiments of the present disclosure. FIG. 12 illustrates a flowchart of an exemplary method for fabricating a semiconductor structure consistent with some embodiments of the present disclosure.

Figure 6:
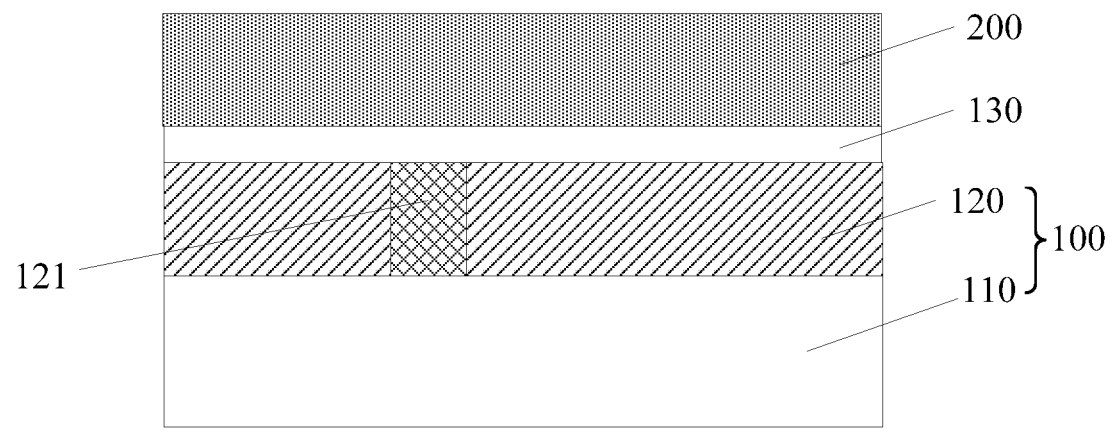
FIGS. 6-11 illustrate schematic cross-sectional views of semiconductor structures at certain stages of an exemplary method for fabricating a semiconductor structure consistent with some embodiments of the present disclosure.

Referring to FIG. 12, at beginning of the fabrication process, a substrate may be provided (S301) and a dielectric layer may be formed on the substrate (S302). FIG. 6 illustrates a schematic cross-sectional view of a corresponding semiconductor structure consistent with various embodiments of the present disclosure.

Referring to FIG. 6, a base substrate 100 may be provided and a dielectric layer 200 may be formed on the base substrate 100.

In one embodiment, the base substrate 100 includes a substrate 110 and an interlayer dielectric layer 120 located on the substrate 110.

In one embodiment, the substrate 110 includes a memory device and a logic device (not shown) on the substrate 110.

In one embodiment, a contact hole may be formed in the interlayer dielectric layer 120. A first metal layer 121 may be filled in the contact hole to form a conductive plug may be formed.

In one embodiment, an etch stop layer 130 may be formed on the base substrate 100 before the dielectric layer 200 is formed.

In one embodiment, the etch stop layer 130 may not be formed before forming the dielectric layer 200.

In one embodiment, the etch stop layer 130 may be made of tungsten nitride, aluminum nitride, silicon nitride, or a combination thereof.

In one embodiment, before forming the dielectric layer 200, the purpose of forming the etch stop layer 130 is to use the etch stop layer 130 to protect the substrate 110, the interlayer dielectric layer 120, and the first metal layer 121 (or conductive plug) under the etch stop layer 130. Thus, the substrate 110, the interlayer dielectric layer 120, and the first metal layer 121 (conductive plug) are prevented from being damaged in the subsequent process, so that the quality of the formed semiconductor device is improved.

In one embodiment, the dielectric layer 200 may be made of a non-nitrogen-containing material, such as silicon oxide, silicon carbide, etc. In one embodiment, the dielectric layer 200 may be made of a nitrogen-containing material, such as silicon nitride, silicon oxynitride, silicon oxynitride, silicon oxynitride, etc.

In one embodiment, the dielectric layer 200 may be made of silicon oxide. In one embodiment, the dielectric layer 200 may be made of silicon carbide or the like.

In one embodiment, a chemical vapor deposition process may be performed to form the dielectric layer 200 on the base substrate 100. The process parameters of the chemical vapor deposition process are detailed here. The adopted gas includes oxygen, ammonia gas ($NH_3$), and $N(SiH_3)_3$ gas. The flow rate of oxygen may be 20-10000 sccm, the flow rate of ammonia ($NH_3$) gas may be 20-10000 sccm, and the flow rate of $N(SiH_3)_3$ gas may be 20-10000 sccm. The chamber pressure may be 0.01-10 torr, and the temperature may be 30-90° C.

Figure 7:
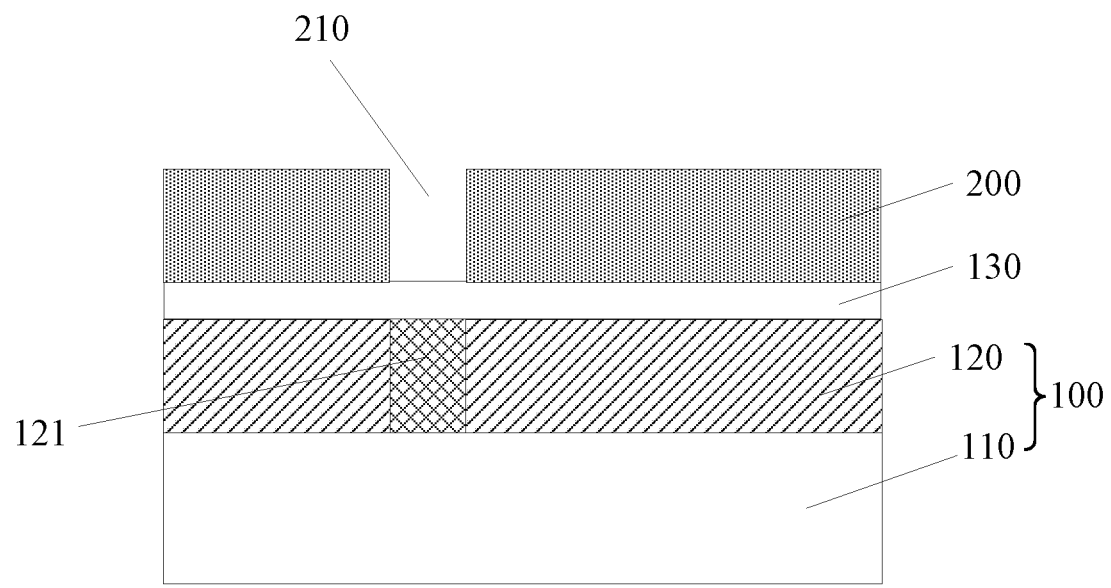

Referring to FIG. 12, a through hole may be further formed in the dielectric layer exposing a portion of a top surface of the substrate (S303). FIG. 7 illustrates a schematic cross-sectional view of a corresponding semiconductor structure consistent with various embodiments of the present disclosure.

Referring to FIG. 7, the dielectric layer 200 may be etched. A through hole 210 may be formed in the dielectric layer 200, and a surface of the etch stop layer 130 may be exposed.

In one embodiment, the through hole 210 may be formed by a dry etching process. The parameters of the dry etching process are detailed here. The adopted reaction gas may include $CF_4$ and $CH_3F$. The flow rate of $CF_4$ may be 20-200 sccm, the flow rate of $CH_3F$ may be 20-50 sccm. The source radio frequency power may be 200-500 watts and the chamber pressure may be 1-10 torr.

In one embodiment, the through hole 210 can be formed by a wet etching process.

Figure 8:
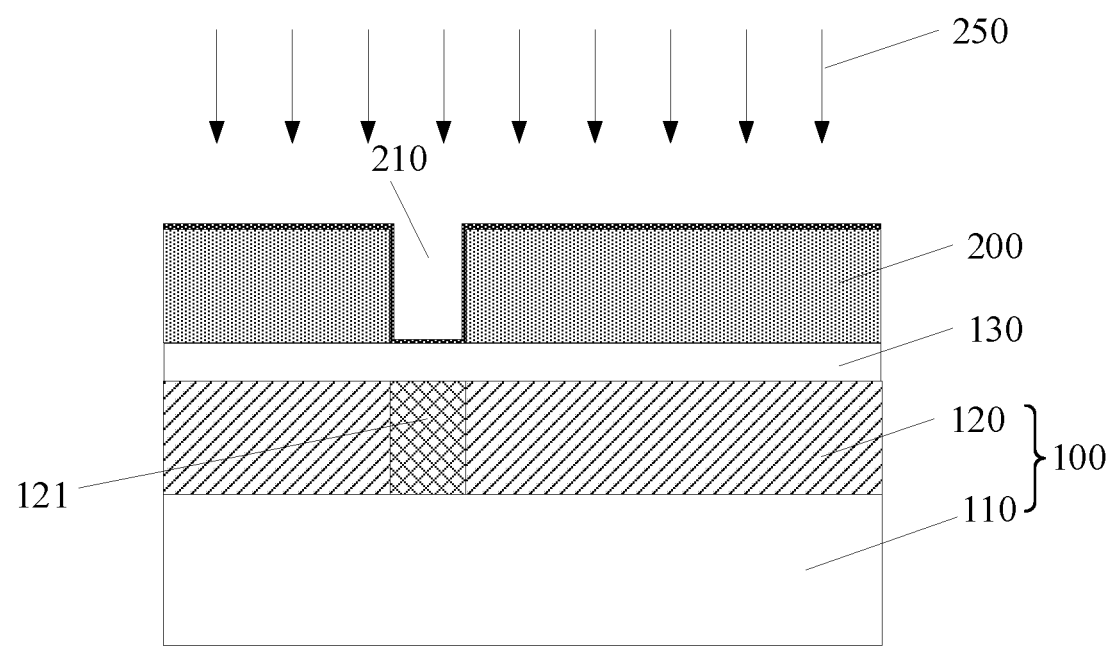

Referring to FIG. 8, a nitridation surface treatment 250 may be performed on the dielectric layer 200 of the sidewalls of the through hole 210. The nitridation surface treatment 250 may include, for example, an ion injection process.

In one embodiment, since the dielectric layer 200 is made of the non-nitrogen-containing material, the dielectric layer 200 of the sidewalls of the through hole 210 is subjected to a nitridation surface treatment before the surface treatment process of the dielectric layer 200 of the sidewalls of the through hole 210 is performed.

In one embodiment, the dielectric layer 200 may be made of a nitrogen-containing material and the dielectric layer 200 does not need the nitridation surface treatment.

In one embodiment, the nitridation surface treatment process may be a plasma surface treatment process. In one embodiment, the nitridation surface treatment process may be an ion doping process.

In one embodiment, the process parameters of the nitridation surface treatment are detailed here. The reaction gas includes ammonia ($NH_3$) and the gas flow rate of the ammonia gas ($NH_3$) may be 500-20000 sccm. The power may be 100-2000 watts and the chamber pressure may be 2-100 mTorr.

In one embodiment, before the surface treatment process, the reason for performing the nitridation surface treatment is to enhance the compactness and improve the blocking effect of the surface of the dielectric layer 200 of the sidewalls of the through hole 210. In addition, after the nitridation surface treatment is performed on the surface of the dielectric layer 200 of the sidewalls of the through hole 210, the dielectric layer 200 contains silicon nitride. The silicon nitride may be working as a transition between materials with different properties, so that when the surface treatment process is performed on the dielectric layer 200, a better surface treatment quality may be achieved on the surface of the dielectric layer 200 and a high-quality semiconductor device may be obtained.

Figure 9:
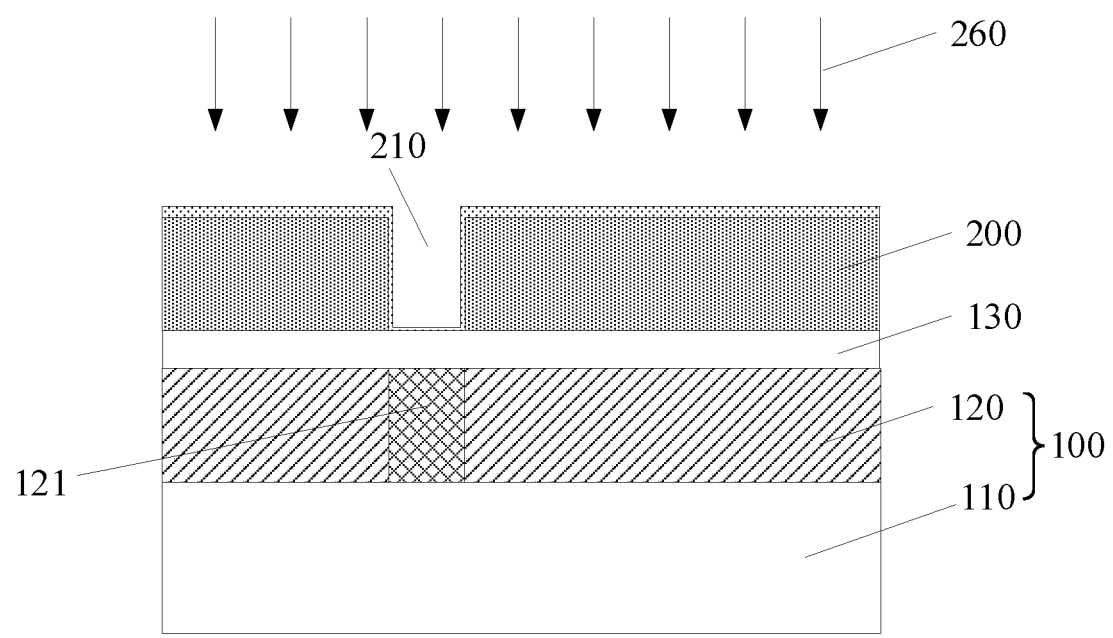

Referring to FIG. 12, a surface treatment process may be further performed on the dielectric layer of sidewalls of the through hole (S304). FIG. 9 illustrates a schematic cross-sectional view of a corresponding semiconductor structure consistent with various embodiments of the present disclosure.

Referring to FIG. 9, a surface treatment 260 may be performed on the dielectric layer 200 of the sidewalls of the through hole 210. The surface treatment 260 may include, for example, an ion injection process.

In one embodiment, the surface treatment process may be a plasma surface treatment process. In one embodiment, the surface treatment process may be an ion doping process.

In one embodiment, the type of the surface treatment process may be a surface tungsten treatment. In one embodiment, the type of the surface treatment process may be a surface ruthenium treatment, a surface cobalt treatment, a surface titanium treatment, or a combination thereof.

In one embodiment, the process parameters of surface tungsten treatment are detailed here. The reaction gas includes $WF_6$ and $H_2$. The gas flow rate of $WF_6$ may be 10-1000 sccm and the gas flow rate of $H_2$ may be 50-20000 sccm. The reaction temperature may be 200-400° C. and the chamber pressure may be 5-100 mTorr.

In one embodiment, after the surface tungsten treatment is performed on the dielectric layer 200 of the sidewalls of the through hole 210, the surface of the dielectric layer 200 has a material property similar to that of tungsten (W), so that a tungsten (W) metal layer may be ready to be formed in the through hole.

Referring to FIG. 10, the etch stop layer 130 may be etched along sidewalls of the through hole 210 until a surface of the first metal layer 121 (conductive plug) is exposed.

In one embodiment, the etch stop layer 130 may be etched until the surface of the first metal layer 121 is exposed, so that after the metal is subsequently filled, the electric connection between the transistor and the metal layer may be realized.

Referring to FIG. 12, a metal layer may be further formed in the through hole (S305). FIG. 11 illustrates a schematic cross-sectional view of a corresponding semiconductor structure consistent with various embodiments of the present disclosure.

Referring to FIG. 11, a metal layer 300 may be filled in the through hole 210. The metal layer 300 may be planarized until the top surface of the metal layer 300 is coplanar with the top surface of the dielectric layer 200.

The metal layer 300 may be made of a material of a same type as the surface treatment process.

In one embodiment, the material of the metal layer 300 may be a tungsten (W) material. In one embodiment, the material of the metal layer 300 may be ruthenium (Ru), cobalt (Co), titanium (Ti), or a combination thereof.

In one embodiment, the metal layer 300 may be formed by a selective growth process. In one embodiment, the metal layer 300 may be formed by a chemical vapor deposition (CVD) process, an atomic layer vapor deposition (ALD) process, a physical vapor deposition (PVD) process, or a combination thereof.

In one embodiment, the parameters for the selective growth process to form the metal layer 300 are detailed here. The reaction gas includes $WF_6$ and Hz. The gas flow rate of the $WF_6$ may be 50-1000 sccm and the gas flow rate of Hz may be 500-20000 sccm. The reaction temperature may be 100-400° C. and the chamber pressure may be 2-100 Torr.

In one embodiment, the reason the metal layer 300 is formed by a selective growth process is that the metal layer 300 formed by the selective growth process is grown gradually from the bottom to the top of the through hole 210, so that the formed metal layer 300 has good compactness. In another aspect, because the dielectric layer 200 of the sidewalls of the through hole 210 is subjected to a precursor treatment, the surface has a lot of polar bonds or charges, etc. Since the surface of the metal layer 300 also has a lot of polar bonds or charges, the metal layer 300 and the dielectric layer 200 may attract each other, so that the metal layer 300 can be easily grown on the bottom and the sidewalls of the through hole 210 and the metal layer 300 may be formed with good quality.

In one embodiment, the precursor treatment is a process to treat each surface before forming the metal layer 300.

Various embodiments of the present disclosure also provide a semiconductor device. As shown in FIG. 11, an exemplary semiconductor device includes: a substrate; and a dielectric layer on the substrate. A through hole is formed in the dielectric layer exposing a portion of a top surface of the substrate and a surface treatment process is performed on the dielectric layer of the sidewalls of the through hole. The semiconductor device further includes a metal layer filled in the through hole.

As disclosed, since the surface treatment process is performed on the dielectric layer 200 of the sidewalls of the through hole 210 before the metal layer 300 is filled, the surface of the dielectric layer 200 after the surface treatment process has a similar material property as that of the filled metal layer 300. The material property difference between the surface of the dielectric layer 200 and the filled metal layer 300 is very small, so that when the metal layer 300 is filled in, the surface of the metal layer 300 and the surface of the dielectric layer 200 are easily adhered to each other, and the metal layer 300 and the dielectric layer 200 have good forming qualities. As such, when the metal layer 300 is planarized, the metal layer 300 and the surface of the dielectric layer 200 are not easy to strip from each other, and the quality and the yield of the formed semiconductor device may be improved.

After the metal layer 300 is formed, an annealing treatment is performed on the filled metal layer 300 before the metal layer 300 is planarized. The temperature of the annealing treatment is 400-450° C. The purpose of the annealing treatment is to facilitate the formation of an amorphous phase of WN/W—N—Si/WSi as a bonding layer between the metal layer 300 and the sidewalls of the through hole 210. The metal layer 300 and the sidewalls of the through hole 210 are well bonded so that the adhesion force between the metal layer 300 and the dielectric layer 200 on the sidewalls of the through hole 210 may be improved. As such, the striping phenomenon between the dielectric layer 200 and the metal layer 300 may be avoided in the process of planarizing the metal layer 300, and the performance and the yield of the formed semiconductor device are improved.

Correspondingly, the disclosure further provides a semiconductor device. The semiconductor device includes a base substrate 100. The base substrate includes a substrate 110 and an interlayer dielectric layer 120, and the interlayer dielectric layer 120 is located on the substrate 110. The semiconductor device further includes a conductive plug. The conductive plug is formed by a first metal layer 121 and the first metal layer 121 is located in the interlayer dielectric layer 120. The semiconductor device further includes an etch stop layer 130 on the interlayer dielectric layer 120, a dielectric layer 200 on the etch stop layer 130, a through hole 210 located in the dielectric layer 200 and exposing the first metal layer 121 at the bottom, and a metal layer 300 filled in the through hole 210 on the first metal layer 121.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a semiconductor device, comprising:
    providing a substrate;
    forming an etch stop layer on the substrate;
    forming a dielectric layer on the layer, wherein the dielectric layer is made of a non-nitrogen containing material; etch stop layer;
    forming an initial through hole in the dielectric layer, the initial through hole exposing a portion of a top surface of the etch stop layer;
    performing a nitridation surface treatment on the dielectric layer of the sidewalls of the initial through hole;
    after performing the nitridation surface treatment, performing an another surface treatment process on the dielectric layer of sidewalls of the initial through hole;

after performing the another surface treatment process, etching the etch stop layer to expose a portion of a top surface of the substrate and convert the initial through hole to an actual through hole; and filling a metal layer in the actual through hole.

2. The method according to claim 1, wherein:

the another surface treatment process includes a plasma surface treatment process, an ion doping process, or a combination thereof.

3. The method according to claim 1, wherein:

the another surface treatment process includes a ruthenium-containing surface treatment, a tungsten-containing surface treatment, a cobalt-containing surface treatment, a titanium-containing surface treatment, or a combination thereof.

4. The method according to claim 3, wherein:

the metal layer is made of a material containing a same metal as used in the another surface treatment process.

5. The method according to claim 1, wherein:

the substrate includes a conductive plug, and the actual through hole exposes a portion of a top surface of the conductive plug.

6. The method according to claim 5, wherein before filling the metal layer in the actual through hole, the portion of the top surface of the conductive plug is exposed after the etch stop layer is etched.

7. The method according to claim 1, wherein:

the dielectric layer is formed by a chemical vapor deposition process, an atomic layer deposition process, a physical vapor deposition process, or a combination thereof.

* * * * *